United States Patent
Wang et al.

(10) Patent No.: US 11,195,592 B2
(45) Date of Patent: Dec. 7, 2021

(54) MEMORY INSPECTING METHOD AND MEMORY INSPECTING SYSTEM

(71) Applicant: Integrated Silicon Solution Inc., Milpitas, CA (US)

(72) Inventors: PaiLu Dennis Wang, Milpitas, CA (US); Lien-Sheng Yang, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 0 days.

(21) Appl. No.: 17/009,990

(22) Filed: Sep. 2, 2020

(65) Prior Publication Data

US 2021/0257042 A1 Aug. 19, 2021

(30) Foreign Application Priority Data

Feb. 17, 2020 (TW) ................................. 109105044

(51) Int. Cl.
*G11C 29/50* (2006.01)
*G11C 29/56* (2006.01)

(52) U.S. Cl.
CPC .. *G11C 29/50016* (2013.01); *G11C 29/56008* (2013.01)

(58) Field of Classification Search
CPC .................... G11C 29/50016; G11C 29/56008
See application file for complete search history.

(56) References Cited

U.S. PATENT DOCUMENTS

| | | | |
|---|---|---|---|
| 2014/0056052 A1* | 2/2014 | Lee .................... | G11C 13/0033 365/145 |
| 2015/0037914 A1* | 2/2015 | Takahashi ........... | H01L 25/0652 438/15 |

* cited by examiner

*Primary Examiner* — Mohammed A Bashar
(74) *Attorney, Agent, or Firm* — McClure, Qualey & Rodack, LLP

(57) ABSTRACT

A memory inspecting method and a memory inspecting system are proposed. The memory inspecting system includes a testing machine and a computer system. The memory inspecting method includes: performing a first data retention time test on a plurality of memory chips to obtain a plurality of first qualified memory chips; performing a second data retention time test on the first qualified memory chips to obtain a plurality of second qualified memory chips; performing a third data retention time test on the second qualified memory chips to obtain a plurality of third qualified memory chips. Performing a statistical analysis step on the third qualified memory chips according to a first data retention time, a second data retention time and a third data retention time of each of the third qualified memory chips is for obtaining at least one final qualified memory chip.

5 Claims, 6 Drawing Sheets

MEMORY INSPECTING METHOD AND MEMORY INSPECTING SYSTEM

RELATED APPLICATIONS

This application claims priority to Taiwan Application Serial Number 109105044, filed Feb. 17, 2020, which is herein incorporated by reference.

BACKGROUND

Technical Field

The present disclosure relates to a memory inspecting method and a memory inspecting system. More particularly, the present disclosure relates to a memory inspecting method and a memory inspecting system suitable for the problems of variable retention time (VRT).

Description of Related Art

Dynamic Random Access Memory (DRAM) is to store electric charge (data) in a capacitor through a transistor. As time goes on, the data stored in the capacitor can disappear. DRAM chip has a problem of Variable Retention Time (VRT). Traditionally, it is detected whether the DRAM chip has the problem of the VRT by writing data to the DRAM chip and performing multiple tests after a period of time to check if the data is lost.

However, even if the DRAM chip is judged as a normal chip in a first test period, the DRAM chip can also be judged as a chip with the problem of the VRT due to data loss in a second test period. Therefore, it is difficult to efficiently detect the chips with the problem of the VRT.

SUMMARY

According to an embodiment of the present disclosure, in a memory inspecting method: First, performing a first data retention time test on a plurality of memory chips to obtain a plurality of first qualified memory chips. Second, performing a second data retention time test on the first qualified memory chips to obtain a plurality of second qualified memory chips. Third, performing a third data retention time test on the second qualified memory chips to obtain a plurality of third qualified memory chips. Each of the third qualified memory chips is tested during a first data retention time, a second retention time and a third retention time. The first data retention time is obtained from the first data retention time test. The second data retention time is obtained from the second data retention time test. The third data retention time is obtained from the third data retention time test. Finally, performing a statistical analysis step on the third qualified memory chips according to the first data retention time, the second data retention time and the third data retention time of each of the third qualified memory chips to obtain at least one final qualified memory chip.

According to another embodiment of the present disclosure, a memory inspecting system includes a testing machine and a computer system. The testing machine is configured to implement the memory inspecting method including: First, performing a first data retention time test on a plurality of memory chips to obtain a plurality of first qualified memory chips. Second, performing a second data retention time test on the first qualified memory chips to obtain a plurality of second qualified memory chips. Third, performing a third data retention time test on the second qualified memory chips to obtain a plurality of third qualified memory chips. Each of the third qualified memory chips is tested during a first data retention time, a second retention time and a third retention time. The first data retention time is obtained from the first data retention time test. The second data retention time is obtained from the second data retention time test. The third data retention time is obtained from the third data retention time test. The computer system is configured to perform a statistical analysis step on the third qualified memory chips according to the first data retention time, the second data retention time and the third data retention time of each of the third qualified memory chips to obtain at least one final qualified memory chip.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
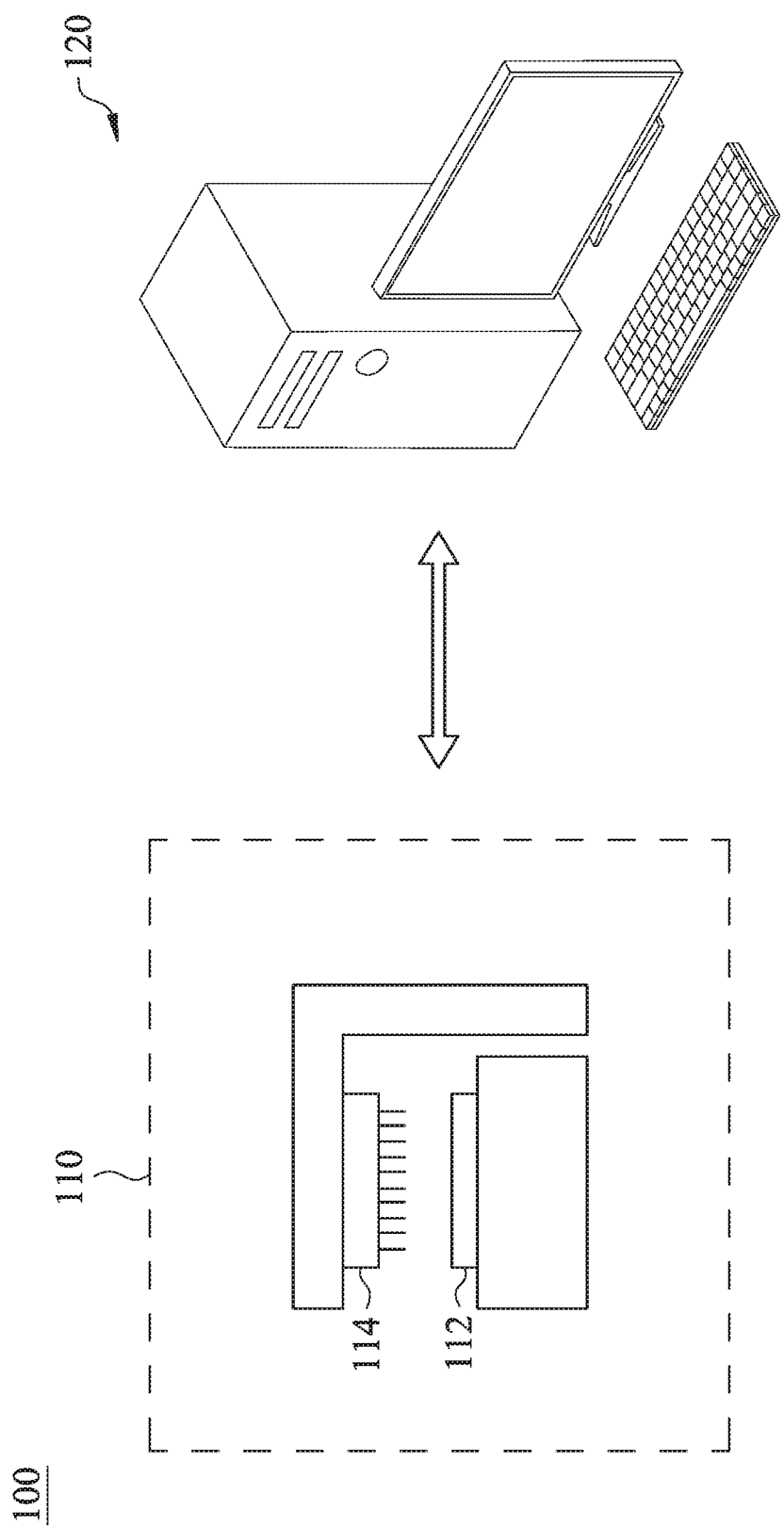
FIG. 1 is a memory inspecting system according to an embodiment of the present disclosure.

Please refer to FIG. 1, which is a memory inspecting system 100 according to an embodiment of the present disclosure. The memory inspecting system 100 includes a testing machine 110 and a computer system 120. The testing machine 110 is configured to perform a test on a plurality of memory chips disposed on a wafer 112 to obtain a test data of each of the memory chips. In the embodiment of the present disclosure, the memory chips on the wafer 112 are Dynamic Random Access Memory (DRAM) chips. The computer system 120 is electrically connected to the testing machine 110 to obtain the test data of the memory chips and analyze the test data.

In the embodiment, the testing machine 110 includes a probe device 114 that can provide electronic signals to the memory chips of the wafer 112 and obtain the test data of the memory chips. The test data can include but is not limited to a location of each of the memory chips and a data retention time of each of the memory chips.

Figure 2:
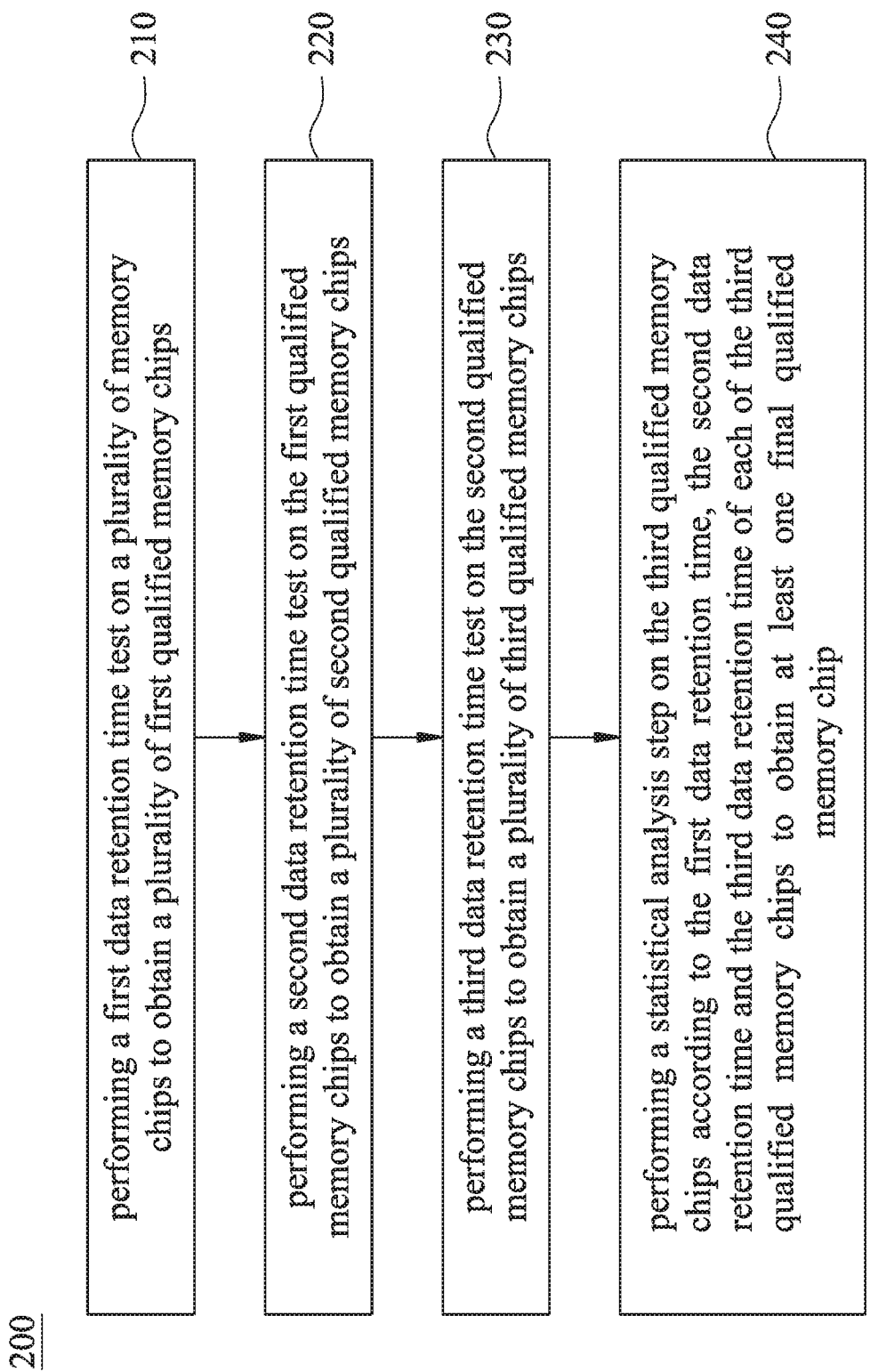
FIG. 2 is a flow chart of a memory inspecting method according to an embodiment of the present disclosure.

Please refer to FIG. 2, which is a flow chart of a memory inspecting method 200 according to an embodiment of the present disclosure. In the memory inspecting method 200, a step 210 is proceeded to perform a first data retention time test on the memory chips on the wafer 112 to obtain a plurality of first qualified memory chips. In the step 210, the data retention time of each of the memory chips is measured by the testing machine 110. Then, the step 210 includes judging whether the memory chips pass the test according to a preset data retention time threshold so as to select the first qualified memory chips therefrom. However, the embodiments of the present disclosure are not limited thereto, and other suitable data retention time testing methods can also be applied in the step 210.

In the memory inspecting method 200, a step 220 is proceeded to perform a second data retention time test on the first qualified memory chips on the wafer 112 to obtain a plurality of second qualified memory chips. Similarly, in the step 220, a data retention time of each of the first qualified memory chips is measured by the testing machine 110. Then, the step 220 includes judging whether the first qualified memory chips pass the test according to the preset data retention time threshold so as to select the second qualified memory chips therefrom. However, the embodiments of the present disclosure are not limited thereto, and other suitable data retention time testing methods can also be applied in the step 220.

In the memory inspecting method 200, a step 230 is proceeded to perform a third data retention time test on the second qualified memory chips on the wafer 112 to obtain a plurality of third qualified memory chips. Similarly, in the step 230, a data retention time of each of the second qualified memory chips is measured by the testing machine 110. Then, the step 230 includes judging whether the second qualified memory chips pass the test according to the preset data retention time threshold so as to select the third qualified memory chips therefrom. However, the embodiments of the present disclosure are not limited thereto, and other suitable data retention time testing methods can also be applied in the step 230.

In the embodiment, a time interval between the first data retention time test and the second data retention time test is at least 6 hours, and a time interval between the second data retention time test and the third data retention time test is at least 6 hours. For example, after the first data retention time test is completed, the second data retention time test will not be performed until at least 6 hours have passed. For another example, after the second data retention time test is completed, the third data retention time test will not be performed until at least 6 hours have passed. In the embodiment, the time interval between the first data retention time test and the second data retention time test is 24 hours, and the time interval between the second data retention time test and the third data retention time test is also 24 hours.

In the memory inspecting method 200, a step 240 is proceeded to perform a statistical analysis on the third qualified memory chips through the computer system 120 so as to obtain at least one final qualified memory chip. In the embodiment, the step 240 is proceeded to perform a statistical analysis step on the third qualified memory chips according to the first data retention time, the second data retention time and the third data retention time of each of the third qualified memory chips to obtain the at least one final qualified memory chip.

Figure 3:
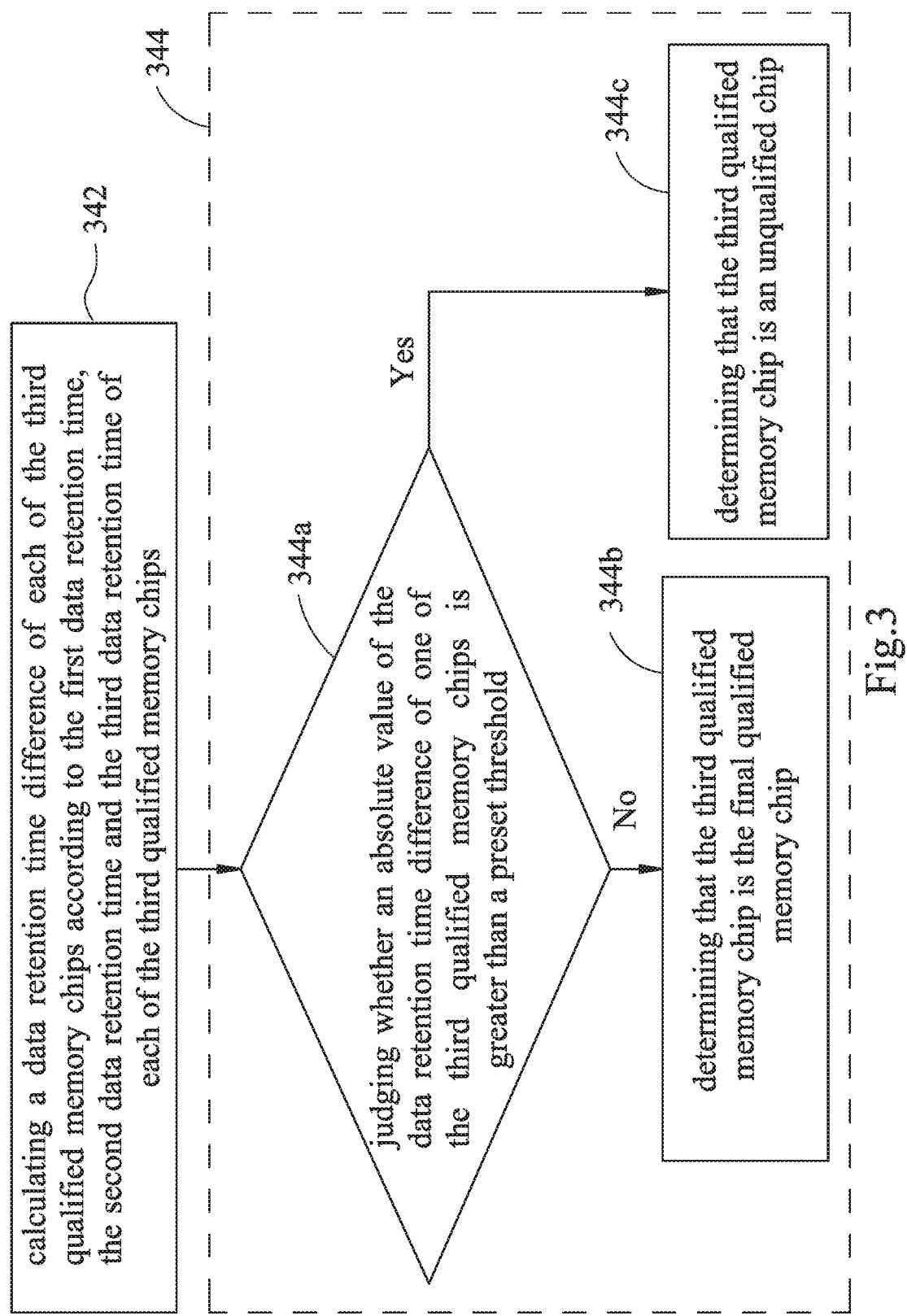
FIG. 3 is a flow chart of a statistical analysis step according to an embodiment of the present disclosure.

Please refer to FIG. 3, which is a flow chart of the step 240 according to an embodiment of the present disclosure. In the embodiment, the step 240 is proceeded to perform the statistical analysis through a difference between the data retention time. In FIG. 3, first, a step 342 is proceeded to calculate a data retention time difference of each of the third qualified memory chips according to the first data retention time, the second data retention time and the third data retention time of each of the third qualified memory chips. For example, the step 342 includes calculating a difference between the first data retention time and the second data retention time, calculating a difference between the second data retention time and the third data retention time, and calculating a difference between the first data retention time and the third data retention time, so that the step 342 can obtain three data retention time differences from each of the third qualified memory chips.

In FIG. 3, a step 344 is performed to judge whether the third qualified memory chip to be analyzed can be the final qualified memory chip. In the step 344, first, a step 344a is proceeded to judge whether an absolute value of the data retention time difference of one of the third qualified memory chips is greater than a preset threshold. In the embodiment, the preset threshold is 30 milliseconds, but the present disclosure is not limited thereto. If the data retention time difference of the third qualified memory chip is not greater than the preset threshold, a step 344b is proceeded to determine that the third qualified memory chip is the final qualified memory chip. If the data retention time difference of the third qualified memory chip is greater than the preset threshold, a step 344c is proceeded to determine that the third qualified memory chip is an unqualified chip.

In the embodiment, the step 344a is performed to judge whether the three data retention time differences from the third qualified memory chip to be analyzed can all be greater than the preset threshold. However, the embodiments of the present disclosure are not limited thereto.

In another embodiment of the present disclosure, the step 344a is performed to judge whether one of the three data retention time differences is greater than the preset threshold to generate a judgment result. If the judgment result is no, the step 344b is proceeded to determine that the third qualified memory chip is the final qualified memory chip. If the judgment result is yes, the step 344c is proceeded to determine that the third qualified memory chip is the unqualified chip.

In another embodiment of the present invention, the step 344a is performed to judge whether two of the three data retention time differences are greater than the preset threshold to generate a judgment result. If the judgment result is no, the step 344b is proceeded to determine that the third qualified memory chip is the final qualified memory chip. If the judgment result is yes, the step 344c is proceeded to determine that the third qualified memory chip is the unqualified chip.

Figure 4:
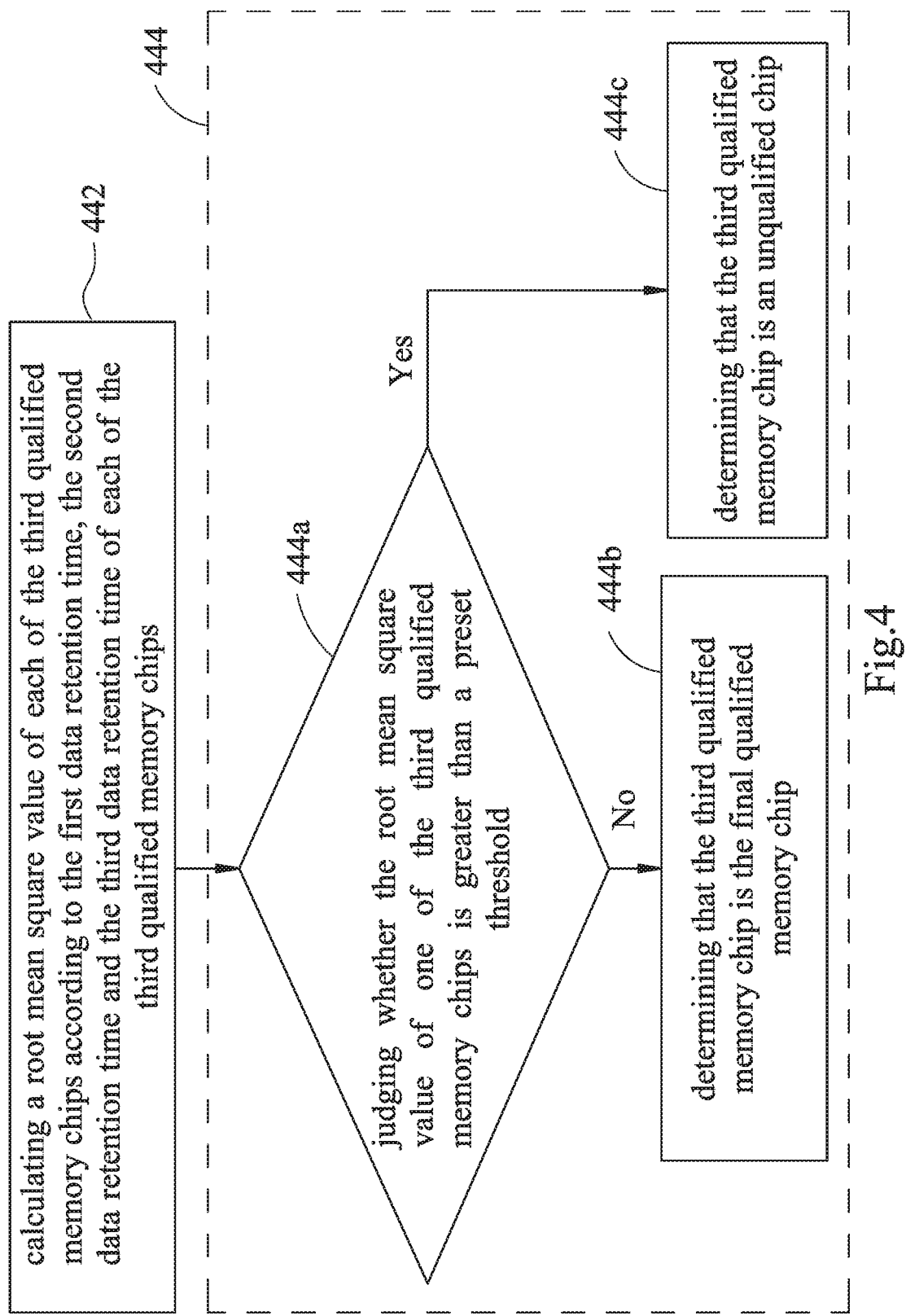
FIG. 4 is a flow chart of a statistical analysis step according to an embodiment of the present disclosure.

Please refer to FIG. 4, which is a flow chart of the step 240 according to an embodiment of the present disclosure. In the embodiment, the step 240 is proceeded to perform the statistical analysis through a root mean square value of the data retention time. In FIG. 4, first, a step 442 is proceeded to calculate the Root Mean Square (RMS) value of each of the third qualified memory chips according to the first data retention time, the second data retention time and the third data retention time of each of the third qualified memory chips. A calculation equation of the root mean square value of the third qualified memory chip is represented as the following equation:

$$R = \sqrt{\frac{D_1^2 + D_2^2 + D_3^2}{3}}. \quad (1)$$

R is the root mean square value of the third qualified memory chip, and $D_1$, $D_2$, and $D_3$ are the three data retention time differences of the third qualified memory chip, respectively.

In FIG. 4, a step 444 is performed to judge whether the third qualified memory chip to be analyzed can be the final qualified memory chip. In the step 444, first, a step 444a is proceeded to judge whether the root mean square value of the third qualified memory chip is greater than the preset threshold. In the embodiment, the preset threshold is 45, but the present disclosure is not limited thereto. If the root mean square value of the third qualified memory chip is not greater than the preset threshold, a step 444b is proceeded to determine that the third qualified memory chip is the final qualified memory chip. If the root mean square value of the third qualified memory chip is greater than the preset threshold, a step 444c is proceeded to determine that the third qualified memory chip is an unqualified chip.

Figure 5:
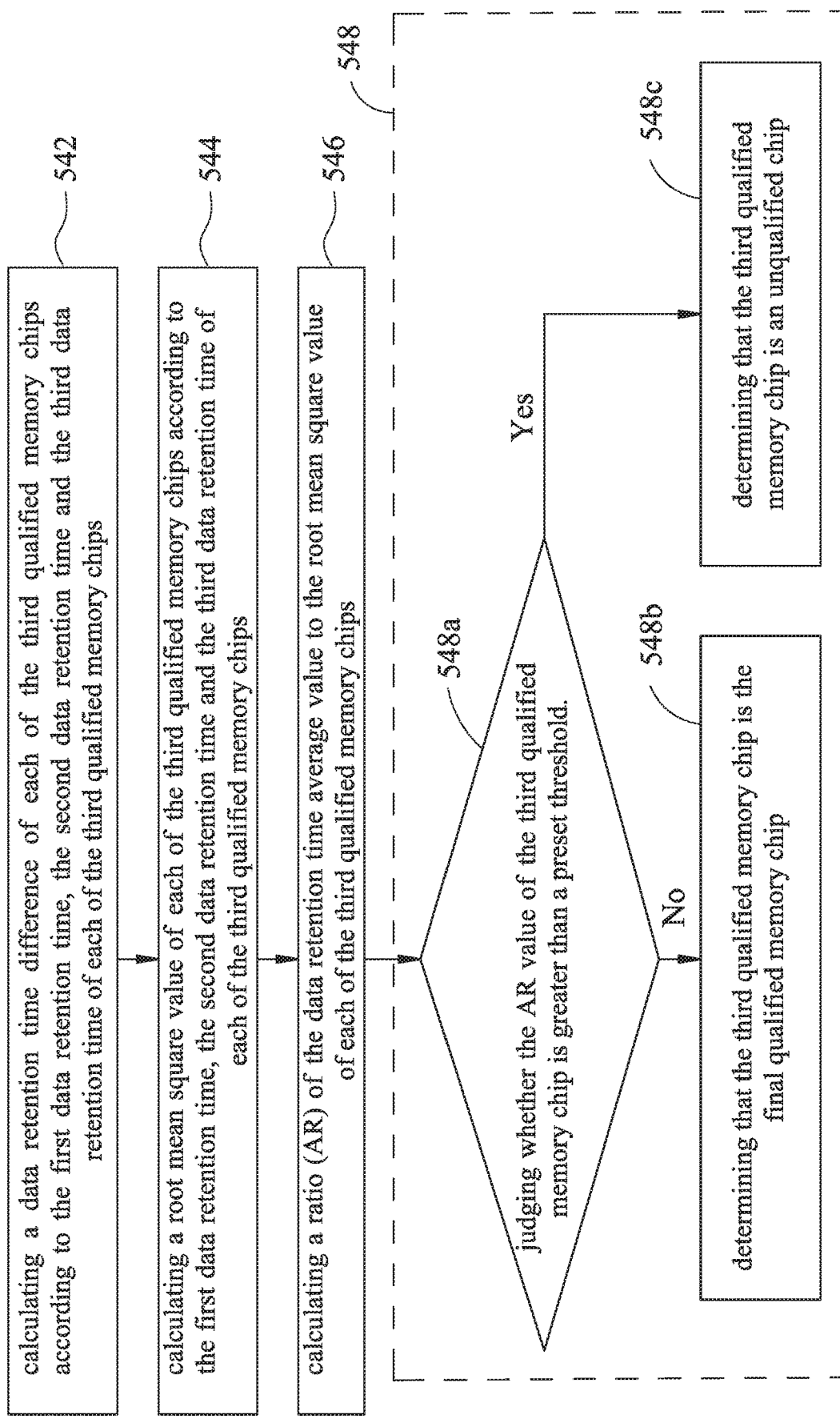
FIG. 5 is a flow chart of a statistical analysis step according to an embodiment of the present disclosure.

Please refer to FIG. 5, which is a flow chart of the step 240 according to an embodiment of the present disclosure. In the embodiment, the step 240 is proceeded to perform the statistical analysis through an AR value of the data retention time. The AR value is a ratio of an average value to the root mean square value of the data retention time. In FIG. 5, first, a step 542 is proceeded to calculate a data retention time average value of each of the third qualified memory chips according to the first data retention time, the second data retention time and the third data retention time of each of the third qualified memory chips. Then, a step 544 is proceeded to calculate the root mean square value of each of the third qualified memory chips according to the first data retention time, the second data retention time and the third data retention time of each of the third qualified memory chips. The step 544 is similar to the aforementioned step 442, so it is not described in detail.

In FIG. 5, a step 546 is proceeded to calculate the ratio (AR) of the data retention time average value to the root mean square value of each of the third qualified memory chips, and the AR value is represented as the following equation:

$$AR = \frac{T_1 + T_2 + T_3}{3R}. \quad (2)$$

$T_1$, $T_2$, and $T_3$ are the first data retention time, the second data retention time and the third data retention time of the third qualified memory chip, respectively.

In FIG. 5, a step 548 is performed to judge whether the third qualified memory chip to be analyzed can be the final qualified memory chip. In the step 548, first, a step 548a is proceeded to judge whether the AR value of the third qualified memory chip is greater than the preset threshold. In the embodiment, the preset threshold is 3, but the present disclosure is not limited thereto. If the AR value of the third qualified memory chip is not greater than the preset threshold, a step 548b is proceeded to determine that the third qualified memory chip is the final qualified memory chip. If the AR value of the third qualified memory chip is greater than the preset threshold, a step 548c is proceeded to determine that the third qualified memory chip is an unqualified chip.

Figure 6:
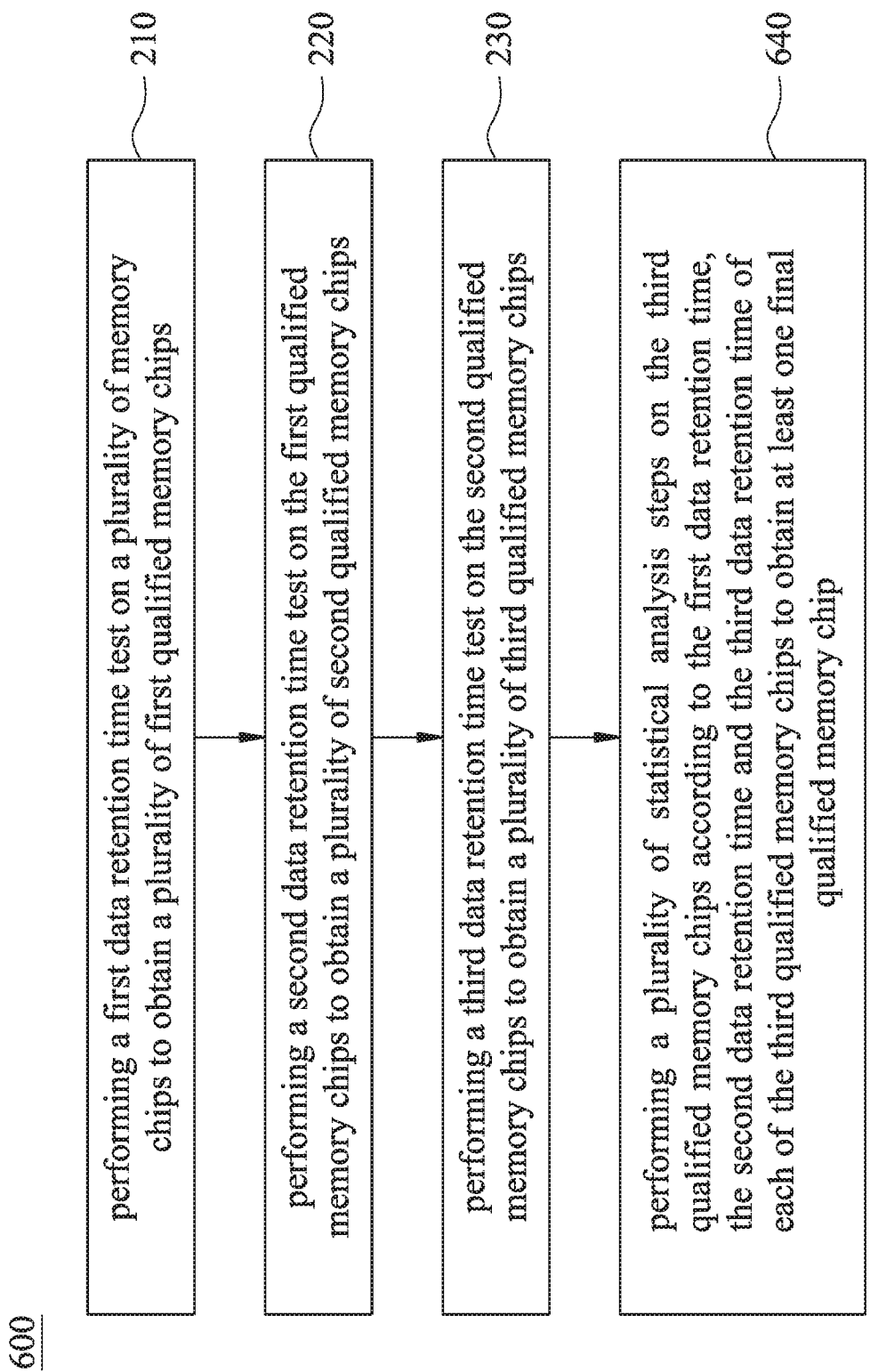
FIG. 6 is a flow chart of the memory inspecting method according to an embodiment of the present disclosure.

Please refer to FIG. 6, which is a flow chart of the memory inspecting method 600 according to an embodiment of the present disclosure. The memory inspecting method 600 is similar to the aforementioned memory inspecting method 200, except that a step 640 in the memory inspecting method 600 integrates plural statistical analysis steps to analyze the third qualified memory chips. For example, a step 640 can integrate the embodiments of FIGS. 3 and 4 (e.g., the steps 344 and 444) to analyze the third qualified memory chips. Specifically, if one of the third qualified memory chips passes the judgment of one of the steps 344 and 444, it is judged that the third qualified memory chip is the final qualified memory chip. For another example, a step 640 can integrate the embodiments of FIGS. 3 to 5 (e.g., the steps 344, 444, and 548) to analyze the third qualified memory chips. Specifically, if one of the third qualified memory chips passes the judgment of one of the steps 344, 444, and 548, it is judged that the third qualified memory chip is the final qualified memory chip.

In summary, the memory inspecting system and the memory inspecting method of the embodiments of the present disclosure perform statistical analysis on memory chips that have passed plural data retention time tests, so that the memory chips with the problem of VRT can be efficiently detected. Further, although the statistical analysis steps of the above embodiments use the data retention time difference, the root mean square value, and the AR value for analysis, the embodiments of the present disclosure are not limited thereto. Other suitable data retention time testing methods can also be applied in the embodiments of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory inspecting method, comprising:
performing a first data retention time test on a plurality of memory chips to obtain a plurality of first qualified memory chips;
performing a second data retention time test on the first qualified memory chips to obtain a plurality of second qualified memory chips;
performing a third data retention time test on the second qualified memory chips to obtain a plurality of third qualified memory chips, wherein each of the third qualified memory chips is tested during a first data retention time, a second data retention time and a third data retention time, the first data retention time is obtained from the first data retention time test, the second data retention time is obtained from the second data retention time test, and the third data retention time is obtained from the third data retention time test; and
performing a statistical analysis step on the third qualified memory chips according to the first data retention time, the second data retention time and the third data retention time of each of the third qualified memory chips to obtain at least one final qualified memory chip;
wherein the statistical analysis step comprises:
calculating a data retention time difference of each of the third qualified memory chips according to the first data retention time, the second data retention time and the third data retention time of each of the third qualified memory chips; and
judging whether an absolute value of the data retention time difference of one of the third qualified memory chips is greater than a preset threshold;
wherein if the absolute value of the data retention time difference is greater than the preset threshold, the one of the third qualified memory chips is judged to be unqualified;
wherein if the absolute value of the data retention time difference is less than or equal to the preset threshold, the one of the third qualified memory chips is judged as the at least one final qualified memory chip.

2. The memory inspecting method of claim 1, wherein a first time interval between the first data retention time test and the second data retention time test is greater than or equal to 6 hours, and a second time interval between the second data retention time test and the third data retention time test is greater than or equal to 6 hours.

3. A memory inspecting system, comprising:
a testing machine configured to implement a memory inspecting method comprising:
performing a first data retention time test on a plurality of memory chips to obtain a plurality of first qualified memory chips;
performing a second data retention time test on the first qualified memory chips to obtain a plurality of second qualified memory chips; and
performing a third data retention time test on the second qualified memory chips to obtain a plurality of third qualified memory chips, wherein each of the third qualified memory chips is tested during a first data retention time, a second data retention time and a third data retention time, the first data retention time is obtained from the first data retention time test, the second data retention time is obtained from the second data retention time test, and the third data retention time is obtained from the third data retention time test; and
a computer system configured to perform a statistical analysis step on the third qualified memory chips according to the first data retention time, the second data retention time and the third data retention time of each of the third qualified memory chips to obtain at least one final qualified memory chip;
wherein the statistical analysis step comprises:
calculating a data retention time difference of each of the third qualified memory chips according to the first data retention time, the second data retention time and the third data retention time of each of the third qualified memory chips; and
judging whether an absolute value of the data retention time difference of one of the third qualified memory chips is greater than a preset threshold;
wherein if the absolute value of the data retention time difference is greater than the preset threshold, the one of the third qualified memory chips is judged to be unqualified;
wherein if the absolute value of the data retention time difference is less than or equal to the preset threshold, the one of the third qualified memory chips is judged as the at least one final qualified memory chip.

4. The memory inspecting system of claim 3, wherein a first time interval between the first data retention time test and the second data retention time test is greater than or equal to 6 hours, and a second time interval between the second data retention time test and the third data retention time test is greater than or equal to 6 hours.

5. A memory inspecting method, comprising:
performing a first data retention time test on a plurality of memory chips to obtain a plurality of first qualified memory chips;
performing a second data retention time test on the first qualified memory chips to obtain a plurality of second qualified memory chips;
performing a third data retention time test on the second qualified memory chips to obtain a plurality of third qualified memory chips, wherein each of the third qualified memory chips is tested during a first data retention time, a second data retention time and a third data retention time, the first data retention time is obtained from the first data retention time test, the second data retention time is obtained from the second data retention time test, and the third data retention time is obtained from the third data retention time test; and
performing a statistical analysis step on the third qualified memory chips according to the first data retention time, the second data retention time and the third data retention time of each of the third qualified memory chips to obtain at least one final qualified memory chip;
wherein the statistical analysis step comprises one of a first analysis step and a second analysis step;
wherein the first analysis step comprises:
calculating a root mean square value of each of the third qualified memory chips according to the first data retention time, the second data retention time and the third data retention time of each of the third qualified memory chips; and
judging whether the root mean square value of one of the third qualified memory chips is greater than a preset threshold;
wherein if the root mean square value is greater than the preset threshold, the one of the third qualified memory chips is judged to be unqualified;
wherein if the root mean square value is less than or equal to the preset threshold, the one of the third qualified memory chips is judged as the at least one final qualified memory chip;
wherein the second analysis step comprises:
calculating a data retention time average value of each of the third qualified memory chips according to the first data retention time, the second data retention time and the third data retention time of each of the third qualified memory chips;
calculating the root mean square value of each of the third qualified memory chips according to the first data retention time, the second data retention time and the third data retention time of each of the third qualified memory chips;
calculating a ratio of the data retention time average value to the root mean square value of each of the third qualified memory chips; and
judging whether the ratio of one of the third qualified memory chips is greater than a preset threshold;
wherein if the ratio is greater than the preset threshold, the one of the third qualified memory chips is judged to be unqualified;
wherein if the ratio is less than or equal to the preset threshold, the one of the third qualified memory chips is judged as the at least one final qualified memory chip.

* * * * *